(12) United States Patent
Kawashima et al.

(10) Patent No.: US 7,489,536 B2
(45) Date of Patent: Feb. 10, 2009

(54) SEMICONDUCTOR INTEGRATED CIRCUIT INCLUDING FUSE CIRCUIT AND METHOD OF MANUFACTURING THE SAME

(75) Inventors: Hidekazu Kawashima, Kanagawa (JP); Toshio Takeshima, Kanagawa (JP); Kenji Gotou, Kanagawa (JP); Kouji Kitamura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 104 days.

(21) Appl. No.: 11/599,293

(22) Filed: Nov. 15, 2006

(65) Prior Publication Data
US 2007/0127284 A1   Jun. 7, 2007

(30) Foreign Application Priority Data
Dec. 6, 2005  (JP)  .............. 2005-352391

(51) Int. Cl.
*G11C 7/00* (2006.01)
(52) U.S. Cl. ................ 365/96; 365/225.7; 365/189.07; 365/189.08; 365/189.09
(58) Field of Classification Search .............. 365/96, 365/225.7, 189.07, 189.08, 189.09
See application file for complete search history.

(56) References Cited

U.S. PATENT DOCUMENTS

| 6,608,498 | B2 * | 8/2003 | Khoury | 324/765 |
| 7,110,313 | B2 * | 9/2006 | Huang | 365/225.7 |
| 7,221,210 | B2 * | 5/2007 | Parker et al. | 327/525 |

FOREIGN PATENT DOCUMENTS

| JP | 2001-118996 | 4/2001 |
| JP | 3307349 | 5/2002 |

* cited by examiner

*Primary Examiner*—Connie C Yoha
(74) *Attorney, Agent, or Firm*—McGinn IP Law Group, PLLC

(57) ABSTRACT

According to an embodiment of the invention, a fuse circuit includes: a pair of fuses; and a comparator circuit connected with nodes on one end side of the fuses through separating switches. The nodes on one end side of the pair of fuses are further connected with a ground terminal through blow switches. The other ends of the pair of fuses are connected with, for example, a power supply potential. Each blow switch is turned ON at the time of blowing the pair of fuses to supply a current to the pair of fuses. Each separating switch separates the comparator circuit from the nodes on one end side at the time of blowing the pair of fuses. One of the pair of fuses is certainly blown upon programming.

18 Claims, 4 Drawing Sheets

SEMICONDUCTOR INTEGRATED CIRCUIT INCLUDING FUSE CIRCUIT AND METHOD OF MANUFACTURING THE SAME

BACKGROUND OF THE INVENTION

1. Field of the Invention

The present invention relates to a semiconductor integrated circuit including a fuse circuit, for example, a memory, and to a method of manufacturing the same.

2. Description of Related Art

Hitherto, as semiconductor integrated circuits such as a memory, a semiconductor integrated circuit including a redundant cell has been known. In the semiconductor integrated circuit including a redundant cell, a cell that is rejected as a defective product during a production stage can be replaced by a prepared redundant cell. Thus, a non-defective semiconductor storage device can be shipped. A processing of detecting a defective cell and replacing a redundant cell in a semiconductor integrated circuit is carried out, for example, by cutting out a fuse provided in a redundancy setting circuit in wafer form where plural chips are formed.

FIG. 5 shows a conventional fuse circuit. As shown in FIG. 5, the fuse circuit 100 includes a fuse 101 having one end grounded, a transistor 102 series-connected with the fuse 101, and a detecting circuit 103 connected with a node between the fuse 101 and the transistor 102.

The transistor 102 is turned ON to blow the fuse 101. The fuse detecting circuit 103 injects charges to the node to detect the fuse blowout. That is, when the fuse burns out, charges are accumulated, and the detecting circuit 103 detects High level. When the fuse does not burn out, charges flow to the ground through the fuse 101, and the detecting circuit 103 detects Low level.

Further, a fuse circuit including two fuses has been proposed in place of the fuse circuit including one fuse (for example, Japanese Patent No. 3307349 (Tamaoki), Japanese Unexamined Patent Application Publication No. 2001-118996 (Kin et al.), or the like). For example, a programming circuit as disclosed by Tamaoki offers a non-defective semiconductor storage device by replacing a cell that is rejected as a defective product during a production stage by a prepared redundant cell. The programming circuit is intended to downsize the entire circuit without using a one-shot signal.

FIG. 6 is a circuit diagram showing the programming circuit as disclosed by Tamaoki. As shown in FIG. 6, the programming circuit 200 includes a pair of p-channel MOS (pMOS) transistors 203 and 204 that constitute a flip-flop and a pair of load elements, two fuses 201 and 202. The fuse 202 includes two fuses 202a and 202b that are series-connected. The fuse 201 as one of the two fuses 201 and 202 is used as a programming unit, and the other fuse 202 has a resistance value that is larger than a resistance value of the fuse 101 before the fuse blowout and smaller than a resistance value of the fuse 101 after the fuse blowout.

In the programming circuit 200, the fuse 201 to be blown and the fuse 202 not to be blown are used as a load of the flip-flop, and an amount of current flowing through the fuse 201 is compared with an amount of current flowing through the fuse 202 to determine whether or not the fuse is blown.

That is, if the fuse 201 opens, a resistance value of the fuse 201 is larger than that of the fuse 202. As a result, the pMOS transistor 103 is turned on, and the common node 205 is connected with a power supply voltage VDD. A potential of the common node 205 becomes High, and the pMOS transistor 204 is turned off. The common node 206 is connected with GND, and its potential becomes Low. On the other hand, if the fuse 201 does not open, a resistance value of the fuse 201 is smaller than that of the fuse 202. Thus, the potentials are changed reversely to the above example; the potential of the common node 205 becomes Low, and the potential of the common node 206 becomes High.

As mentioned above, the flip-flop of the programming circuit 200 immediately comes to a stable state irrespective of whether or not the fuse opens, and it is determined whether or not the fuse opens after a signal RESULT is output.

A technique of comparing resistance values of a blown fuse and a reference fuse to generate an accurate fuse optional signal to improve reliability is disclosed by Kin et al. FIG. 7 is a circuit diagram of a fuse optional circuit of an integrated circuit as disclosed by Kin et al.

As shown in FIG. 7, a fuse optional circuit 300 as disclosed by Kin et al. includes a first fuse F1, a second fuse F2, a fuse blowout unit 320, and an optional signal generating unit 350 having an amplifier. The optional signal generating unit 350 includes a first input unit 352, a second input unit 354, and an operational amplifier 356. A MOS transistor NM9 of the first input unit 352 has a gate and drain connected with a first node N11 and a grounded source. A MOS transistor NM10 as the second input unit 354 has a gate and drain connected with a second node N12 and a grounded source. The operational amplifier 356 includes two PMOS transistors PM3 and PM4, and three NMOS transistors NM11 to NM13. A gate of the MOS transistor NM11 is connected with the first node N11, and a gate of the MOS transistor NM12 is connected with the second node N12. A gate of the MOS transistor NM13 receives an enable signal PEFE. Therefore, the operational amplifier 356 amplifies a potential difference between the first node N11 and the second node N12 to output a fuse optional signal POUT of Low level to an inverted output terminal.

However, if one fuse 101 is used as in the conventional fuse circuit, the fuse 101 may be closed due to any factor after blowout, resulting a problem that reliability is insufficient.

Further, in the technique as disclosed by Tamaoki, if a broken fuse is closed due to any factor, although a high-level signal would normally be output from RESULT, a signal of Low level is output in practice, and an erroneous operation may occur. That is, in the technique as disclosed by Tamaoki, two fuses make a pair; the fuse 201 is blown out, and the fuse 202 is used for comparison purpose. A resistance value of the fuse 202 is set (twice) larger than a resistance value of the fuse 201 before blowout and smaller than a resistance value of the blown fuse. However, in the case where the blown fuse 201 closes, if a resistance value of the closed fuse is smaller than a resistance value of the fuse 202 as a reference fuse, it is determined that the fuse 201 does not burn out.

Further, in the fuse optional circuit as disclosed by Kin et al., only the fuse F1 out of the pair of fuses F1 and F2 is blown out, and the fuse F2 cannot burn out. This makes it difficult to ensure that an output voltage level of the terminal POUT in the case where neither the fuse F1 nor the fuse F2 burns out is unequal to an output voltage level of the terminal POUT in the case where the fuse F1 burns out.

SUMMARY OF THE INVENTION

According to an aspect of the present invention, a semiconductor integrated circuit including a fuse circuit, includes: two blow switches connected with a ground potential; a pair of fuses connected between a power supply voltage and the two blow switches respectively and programmed by turning on one of the blow switches and blowing one of the pair of fuses; and a detector detecting a level of a voltage applied to the fuses upon the programming.

According to another aspect of the invention, a method of manufacturing a semiconductor integrated circuit including a fuse circuit, includes: mounting a plurality of cells and a fuse circuit including a pair of fuses and a detector detecting a voltage of a voltage applied to the pair of fuses onto a semiconductor substrate; checking a quality of the plurality of cells; blowing one of the pair of fuses based on a result of the quality check; and detecting a level of the voltage applied to the pair of fuses with the detector to execute programming.

According to the present invention, one of a pair of fuses is blown upon programming, whereby even if a burnt fuse closes due to any factor, an output level of a detector never changes, so a programming error never occurs. Therefore, according to the present invention, it is possible to provide a highly reliable semiconductor integrated circuit including a fuse circuit and a method of manufacturing the same.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
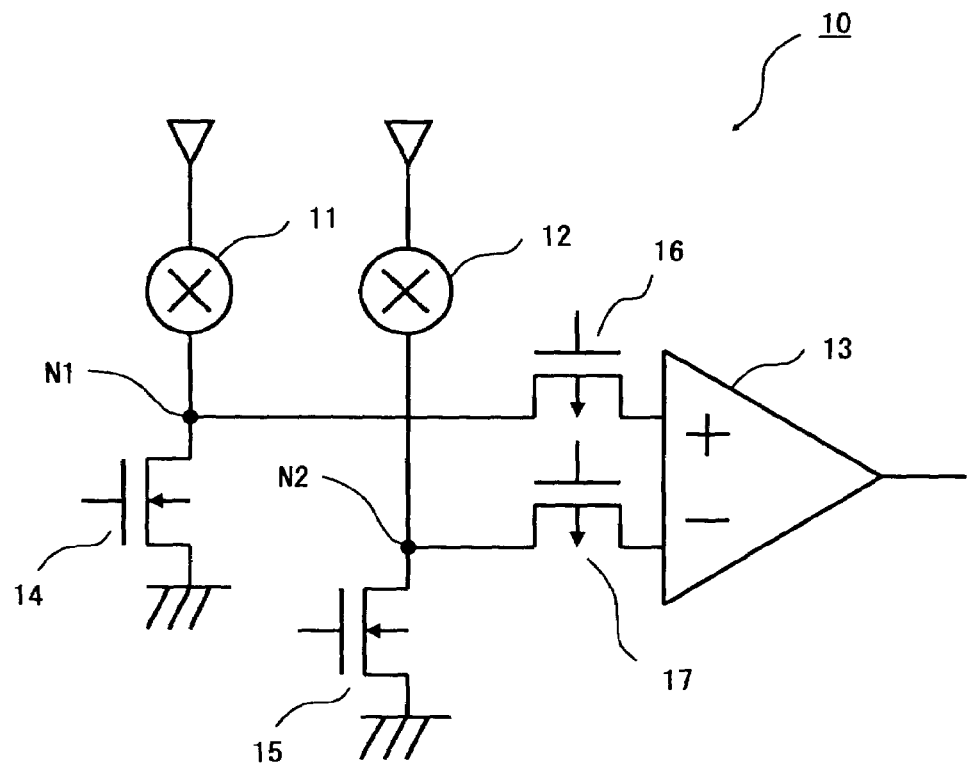
FIG. 1 shows a fuse circuit according to a first embodiment of the present invention.

Hereinafter, embodiments of the present invention are described in detail with reference to the accompanying drawings. FIG. 1 shows a fuse circuit according to a first embodiment of the present invention. As shown in FIG. 1, a fuse circuit 10 of this embodiment includes a pair of fuses 11 and 12, and a comparator circuit 13 connected with nodes N1 and N2 on one end side of the fuses 11 and 12 through separating switches 16 and 17. The two fuses 11 and 12 constitute a pair of fuse circuits. Resistance values of the two fuses 11 and 12 can be substantially equal.

The nodes N1 and N2 on one end side of the fuses 11 and 12 are further connected with the ground through blow switches 14 and 15. Then, the other ends of the fuses 11 and 12 are connected with, for example, a power supply potential.

The blow switches 14 and 15 are turned ON at the time of blowing out the fuses 11 and 12 to pass a current through the fuses 11 and 12. Further, the separating switches 16 and 17 are used to input a value to the comparator circuit 13 as well as to separate the comparator circuit 13 from the nodes N1 and N2 and prevent voltage application to input terminals thereof at the time of blowing out the fuses 11 and 12.

In the fuse circuit 10, one of the fuses 11 and 12 is blown upon programming. The comparator circuit 13 functions as a detector detecting which fuse burns out based on a level of voltage applied to the fuses 11 and 12, that is, a potential difference therebetween.

In the case of blowing out the fuse 11, the separating switch 16 is turned OFF, and the blow switch 14 is turned ON to allow a current to flow through the fuse 11. The fuse 11 is made up of, for example, thin copper wire, and is designed to open when a current flows therethrough. When the fuse 11 burns out, a potential of the node N1 becomes a ground potential. If the separating switch 16 is turned ON, a potential of a positive terminal of the comparator 13 becomes a ground potential. On the other hand, a potential of a negative terminal connected with the not-burnt fuse 12 is kept at High level. As a result, the comparator circuit 13 outputs a voltage of Low level.

At the time of blowing out the fuse 12, the separating switch 17 is turned OFF, and the blow switch 15 is turned ON to allow a current to flow through the fuse 12. As a result, the fuse 12 burns out, and then a potential of the node N2 becomes a ground potential. When the separating switch 18 is turned ON, a potential of the negative terminal of the comparator 13 becomes a ground potential. On the other hand, a potential of the negative terminal connected with the not-burnt fuse 12 is kept at High level. As a result, the comparator circuit 13 outputs a voltage of Low level.

Further, if the burnt fuse closes, for example, even if the fuse 11 burns out and then closes, a potential of the node N1 is lower than that of the node N2 unless a resistance value of the fuse 11 is returned to a resistance value of the fuse before blow. Therefore, even in the case where the fuse burns out, or burns out and then closes, a potential of the node N1 is lower than a potential of the node N2 in either case, and the detector 13 necessarily outputs a voltage of Low level. Hence, this embodiment can offer the fuse circuit 10 of high reliability.

On the other hand, in the technique as disclosed by Kin et al., if neither a fuse F1 nor a fuse F2 is blown, it is necessary to design a fuse circuit such that an output voltage level of a terminal POUT in the case where the fuse F1 burns out becomes unequal to an output voltage level of the terminal POUT in the case where the fuse F1 does not burn out.

In the fuse optional circuit as disclosed by Kin et al., if the fuse F1 burns out, a voltage of Low level is output at the terminal POUT. Thus, if the fuse F1 is not blown, the circuit should ensure that a voltage of High level is output from the terminal POUT. In this example, the following methods can be adopted. That is, for example, an operational amplifier 256 is given an offset. The circuit is designed to ensure that a voltage of High level is output at the terminal POUT if a potential of the node N2 and a potential of the node N1 are at the same level. Alternatively, input units 252 and 254 are made unbalanced. The circuit is designed to ensure that a potential of the node N2 is lower than that of the node N2 if neither F1 nor F2 burns out.

However, even if the circuit is thus designed, in the case where the burnt fuse closes, a resistance value of the closed fuse becomes smaller than the original resistance value, with the result that a potential of a node N11 increases. Accordingly, in some cases, a potential of the node N11 becomes higher than that of a node N12, resulting in a problem in that a desired output voltage cannot be attained at the terminal POUT.

In contrast, in this embodiment, one fuse of the fuse pair certainly burns out upon programming, in order to determine a voltage at an output OUT of the comparator circuit 13. Therefore, even if the burnt fuse closes due to any factor, a programming error never occurs unless its resistance value is absolutely returned to the original resistance value. That is, even if the fuse burns out, or burns out and then closes, an output level of the output OUT is constant (High or Low). Thus, a highly reliable fuse circuit can be provided.

Figure 2:
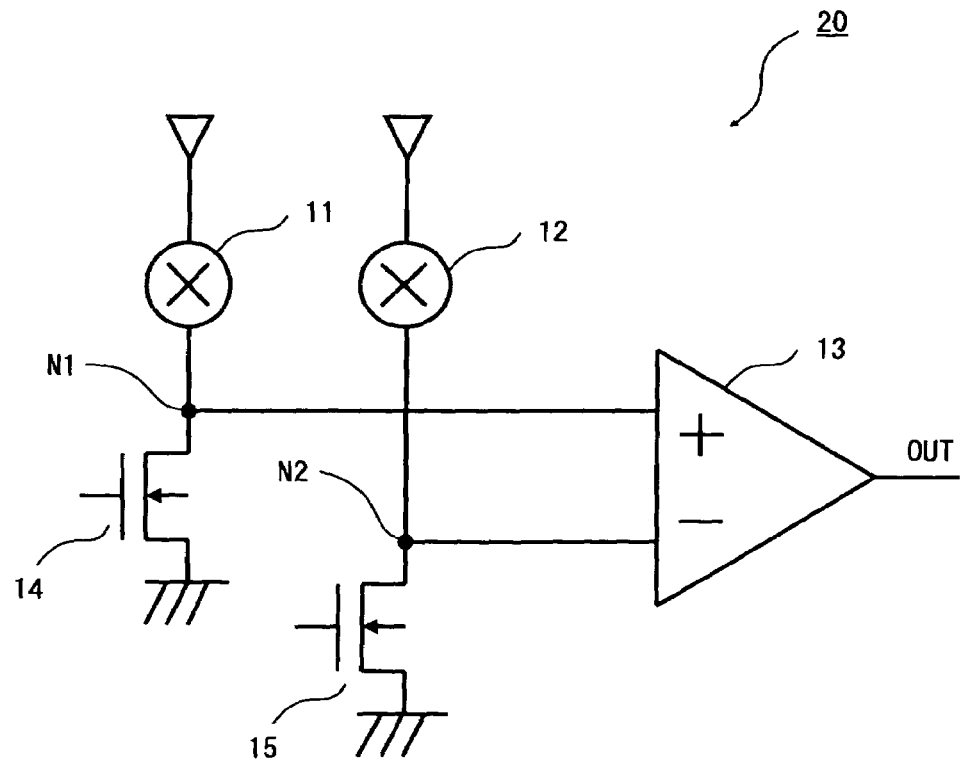
FIG. 2 shows a fuse circuit according to a modified example of the first embodiment.
Figure 3:
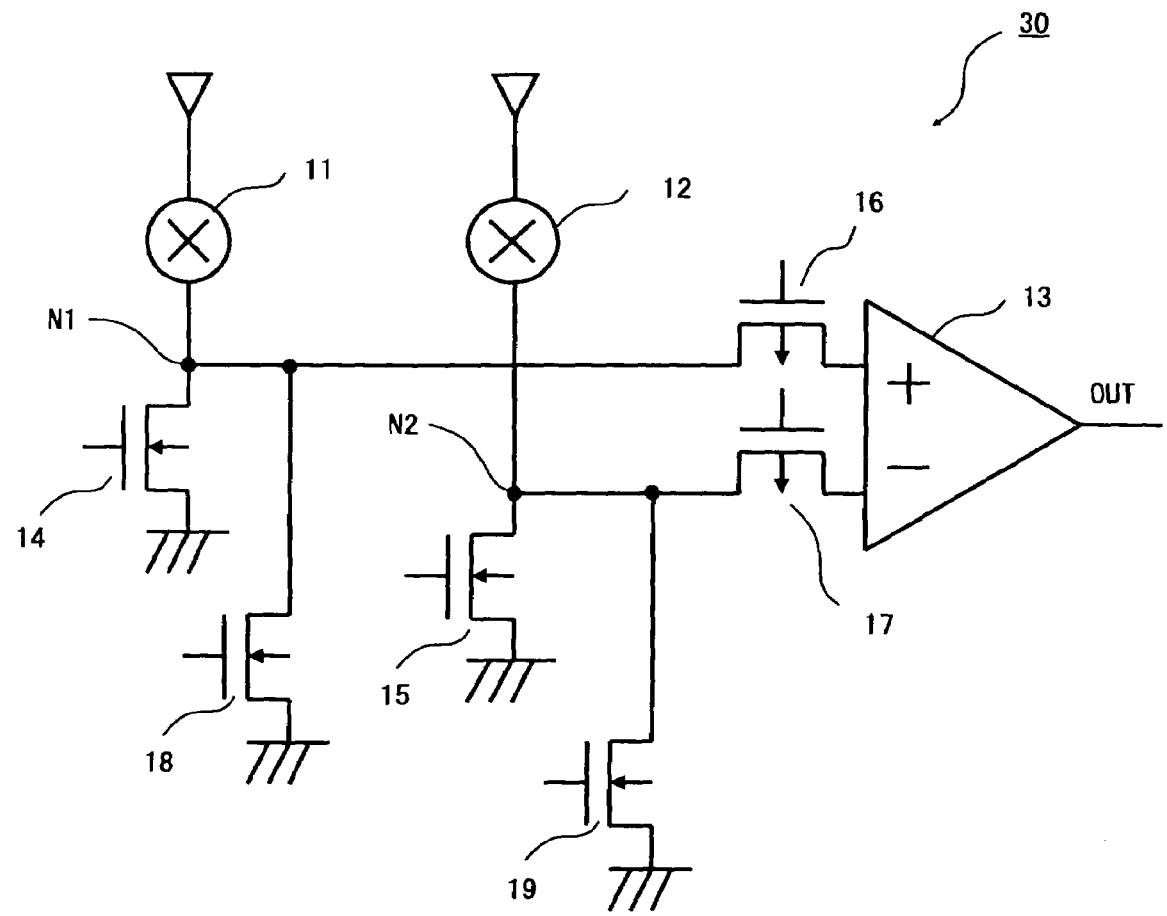
FIG. 3 shows a fuse circuit according to another modified example of the first embodiment.

Next, modified examples of this embodiment are described. FIGS. 2 and 3 show the modified examples of this embodiment. In the configuration of FIG. 1, the switches 16 and 17 are provided to prevent erroneous operations of the detector 13 upon the fuse blowout. However, these switches may be omitted as in a fuse circuit 20 of FIG. 2.

As shown in FIG. 3, the circuit of the first embodiment may be replaced by a fuse circuit 30 where switches 18 and 19 are additionally connected with the node N1, node N2. The switches 14 and 15 are blow switches. A transistor of a reliably large size should be used as the switches 14 and 15 for supplying blow current to the fuses 11 and 12. After the fuse blow, the switches 14 and 15 only need to connect the nodes N1 and N2 to the ground. Therefore, as discussed in this modified example, small grounding transistors 18 and 19 may be separately provided.

Second Embodiment

Figure 4:
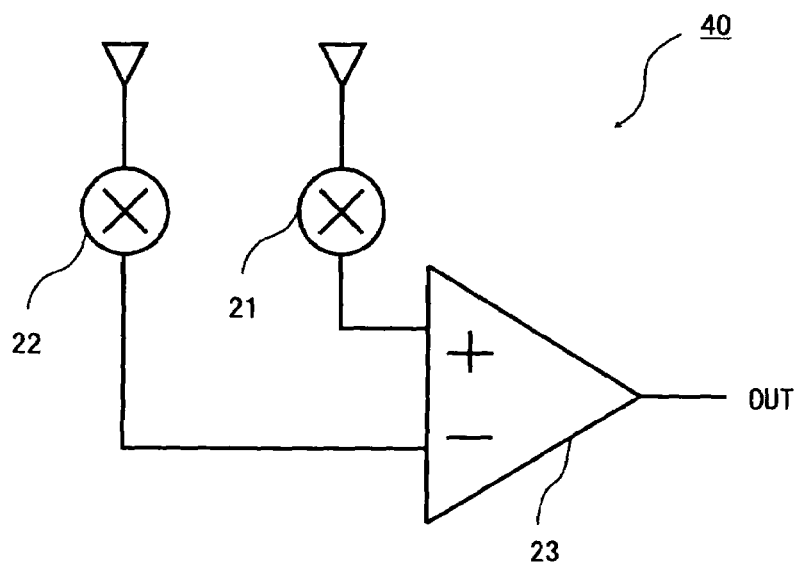
FIG. 4 shows a fuse circuit according to a second embodiment of the present invention.
Figure 5:
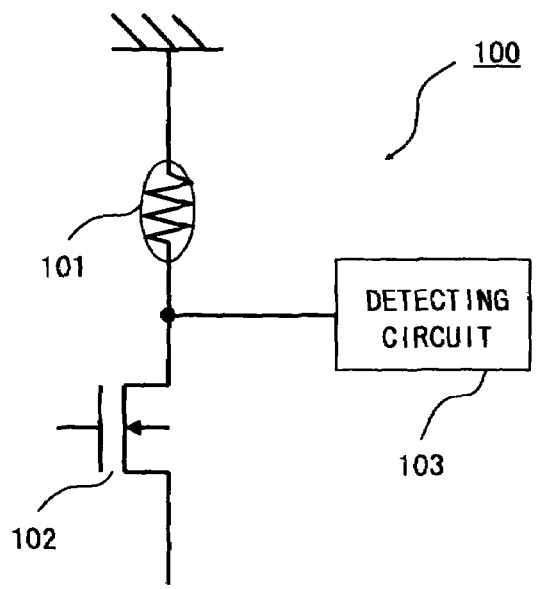
FIG. 5 shows a conventional fuse circuit.
Figure 6:
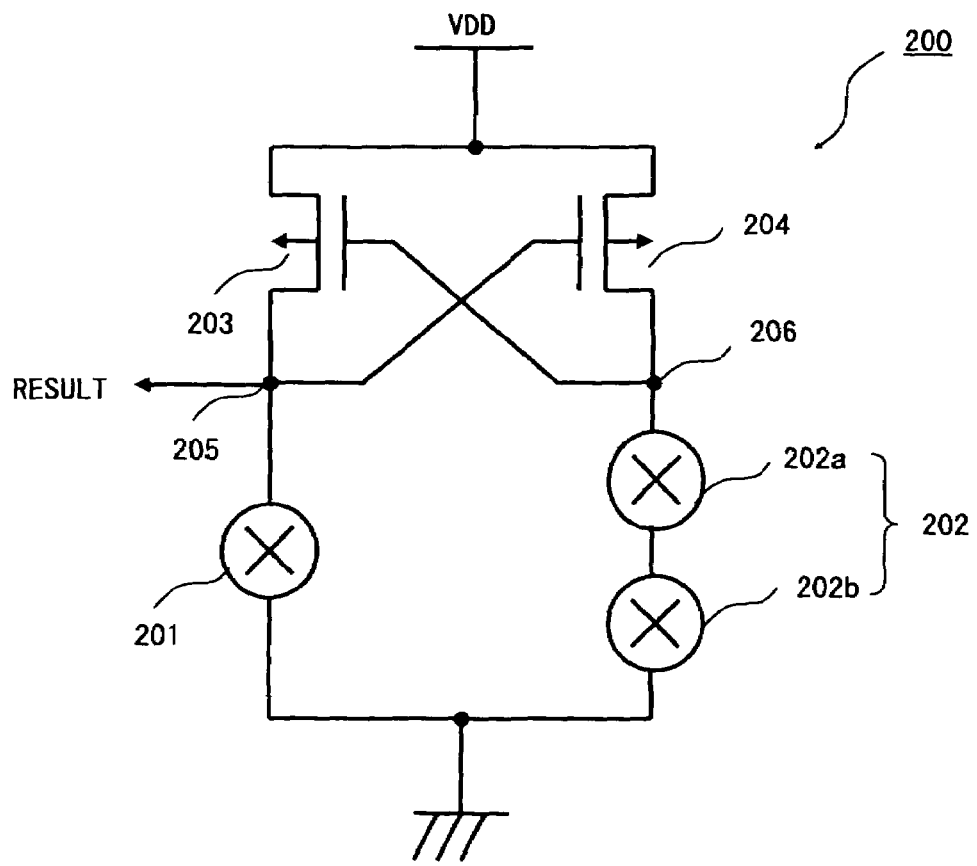
FIG. 6 shows a programming circuit as disclosed by Tamaoki.
Figure 7:
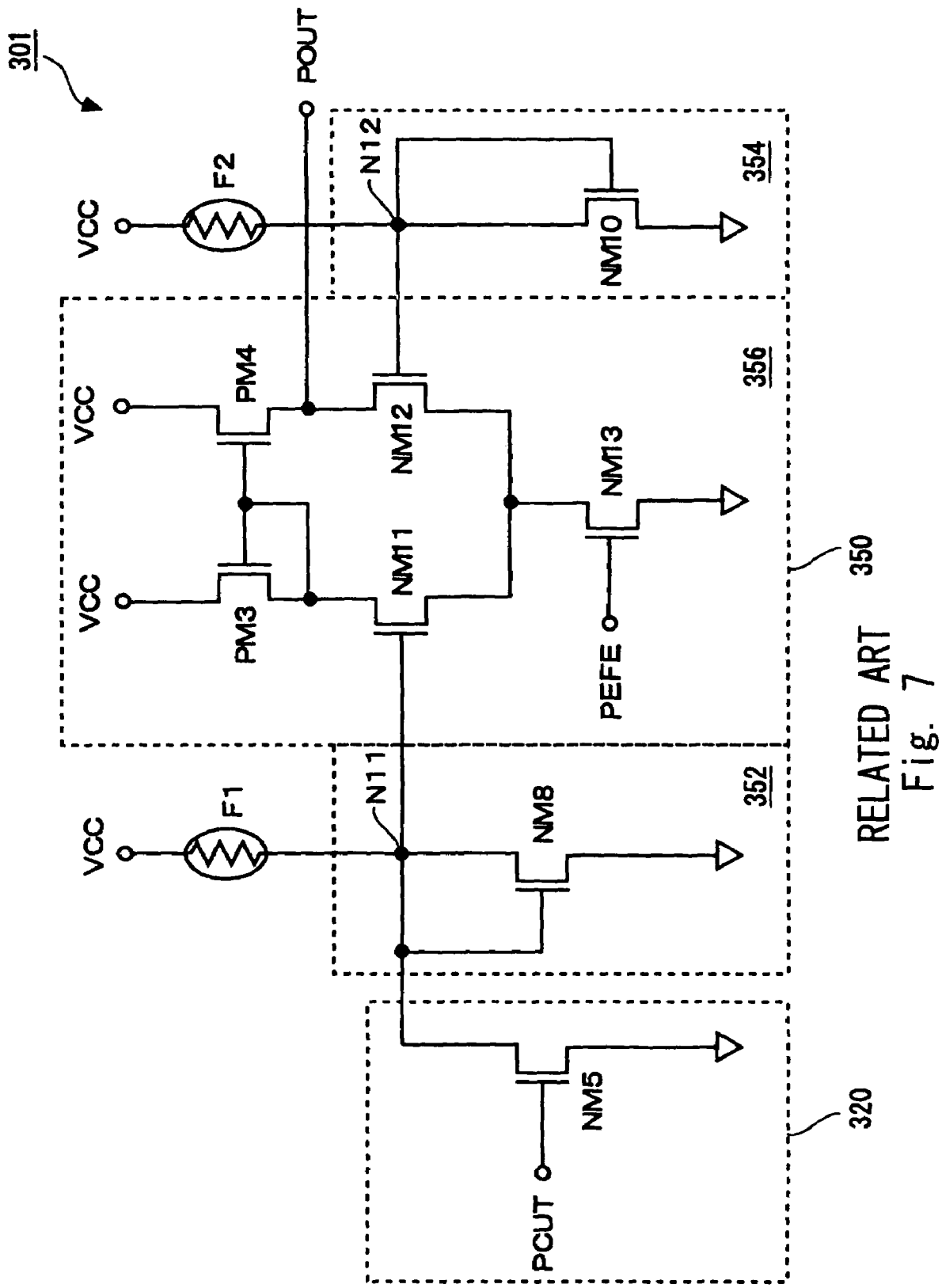
FIG. 7 shows a fuse optional circuit as disclosed by Kin et al.

Next, a second embodiment of the present invention is described. FIG. 4 shows a fuse circuit according to a second embodiment of the present invention. As shown in FIG. 4, a fuse circuit 40 of this embodiment includes fuses 21 and 22, and a comparator circuit 23. The two fuses 21 and 22 constitute a pair fuse circuits. The two fuses 21 and 22 are set to have substantially the same resistance value.

Positive and negative terminals of the comparator circuit 23 are connected with one ends of the fuses 21 and 22, respectively. The other ends of the fuses 21 and 22 are connected with a power supply voltage. The fuse circuit 40 blows out one of the two fuses 21 and 22 upon programming. The comparator circuit 23 functions as a detector detecting which fuse burns out based on a level of voltage applied to the fuses 21 and 22, that is, a potential difference therebetween.

Here, the fuses 21 and 22 of the fuse circuit 40 of this embodiment may be made of, for example, polysilicon, and blown through laser application. Alternatively, the fuses 21 and 22 may be made up of copper wire or the like, and blown by providing switches etc. to pass a current through the fuses as in the first embodiment.

For example, if the fuse 21 connected with the positive terminal burns out, a potential of the negative terminal becomes High, and the comparator circuit 23 outputs a voltage of Low level. Further, if the fuse 22 connected with the negative terminal is blown, a potential of the positive terminal becomes High, and the comparator circuit 23 outputs a voltage of High level.

As mentioned above, in this embodiment, it is possible to determine whether a potential of the output OUT of the comparator circuit 23 becomes Low or High by blowing out one of the fuses. Further, even if the burnt fuse closes due to any factor, an output voltage level of the output OUT is fixed unless its resistance value becomes equal to or smaller than the resistance value of the fuse before the blowout. Therefore, a programming error can be avoided.

Next, a method of manufacturing the semiconductor integrated circuit including a fuse circuit is explained. For example, in a semiconductor integrated circuit such as a memory, a redundant cell is provided beforehand to replace a cell that is rejected as a defective product during a production stage. The fuse circuit is used for replacing the defective cell by the redundant cell, for example.

First, in the semiconductor integrated circuit typified by a memory, plural cells and the above fuse circuits are built on a substrate. Incidentally, if the fuses 21 and 22 are made up of the copper wire, any special step is unnecessary for forming the fuse, and its production is facilitated.

After that, the quality of each of the plural cells built on the substrate is checked. If a defective cell is found in the quality checking step, the fuse circuit executes programming to replace the defective cell by a redundant cell. Upon the programming, in this embodiment, if no defective cell is found, one of the fuses is blown to determine an output level of the output OUT.

For example, in such configuration that the defective cell is replaced by a redundant cell if a voltage of High level is output, or the defective cell is not replaced by a redundant cell if a voltage of Low level is output, a defective cell is first detected, and the fuse 22 is blown only in the defective cell. If no defective cell is detected, the fuse 21 is blown. That is, one of the fuses 21 and 22 burns out without fault irrespective of whether or not a defective cell is detected. After the completion of replacement with the redundant cell, a non-defective semiconductor integrated circuit can be delivered.

In this embodiment, the integrated circuit incorporating the fuse circuit certainly blows out one of the fuses in the final step to thereby determine an output voltage of the detector. Further, in the fuse circuit, even if the fuse burns out and then closes, an output level of the detector is constant, so a highly reliable semiconductor integrated circuit can be provided.

It is apparent that the present invention is not limited to the above embodiment that may be modified and changed without departing from the scope and spirit of the invention.

What is claimed is:

1. A semiconductor integrated circuit including a fuse circuit, comprising:
   two blow switches connected with a ground potential;
   a pair of fuses connected between a power supply voltage and the two blow switches respectively and programmed by turning on one of the blow switches and blowing one of the pair of fuses; and
   a detector detecting a level of a voltage applied to the pair of fuses upon the programming.

2. The semiconductor integrated circuit including a fuse circuit according to claim 1, further comprising a separating switch provided between a respective one of the pair of fuses and the detector,
   wherein the separating switch separates the fuses from the detector upon the programming.

3. The semiconductor integrated circuit including a fuse circuit according to claim 1, further comprising a grounding switch parallel-connected with the blow switches,
   the grounding switch connecting the other ends of a respective one of the pair of fuses to the ground terminal after the programming.

4. The semiconductor integrated circuit including a fuse circuit according to claim 2, further comprising a grounding switch parallel-connected with the blow switches,
   the grounding switch connecting a respective one of the other ends of the pair of fuses to the ground terminal after the programming.

5. A semiconductor integrated circuit including a fuse circuit, comprising:
- a first blow switch;
- a second blow switch;
- a first fuse, whose one end is connected with a fixed potential, whose the other end is connected with the first blow switch;
- a second fuse, whose one end is connected with the fixed potential, whose the other end is connected with the second blow switch; and
- a detector detecting a potential difference between the other end of the first fuse and the other end of the second fuse.

6. A method of manufacturing a semiconductor integrated circuit including a fuse circuit, comprising:
- mounting a plurality of cells and a fuse circuit including a pair of fuses and a detector detecting a voltage of a voltage applied to the pair of fuses onto a semiconductor substrate;
- checking a quality of the plurality of cells;
- blowing one of the pair of fuses based on a result of the quality check; and
- detecting a level of the voltage applied to the pair of fuses with the detector to execute programming.

7. The semiconductor integrated circuit including a fuse circuit according to claim 1, wherein a resistance of each of the pair of fuses is substantially equal.

8. The semiconductor integrated circuit including a fuse circuit according to claim 1, wherein the blow switches turn on when one of the pair of fuses blows out.

9. The semiconductor integrated circuit including a fuse circuit according to claim 2, wherein the separating switch inputs a value to the detector.

10. The semiconductor integrated circuit including a fuse circuit according to claim 2, wherein the separating switch prevents a voltage application to input terminals of the detector when one of the pair of fuses blows out.

11. The semiconductor integrated circuit including a fuse circuit according to claim 1, wherein the detector detects which one of the pair of fuses is blown out according to a potential difference between the pair of fuses.

12. The semiconductor integrated circuit including a fuse circuit according to claim 2, wherein the separating switch comprises a first separating switch and a second separating switch, the first separating switch being provided between a first one of the pair of fuses and the detector and the second separating switch being provided between a second one of the pair of fuses and the detector.

13. The semiconductor integrated circuit including a fuse circuit according to claim 3, wherein the grounding switch comprises a first grounding switch and a second grounding switch, the first grounding switch being provided between a first one of the pair of fuses and the ground terminal and the second grounding switch being provided between a second one of the pair of fuses and the grounding terminal.

14. The semiconductor integrated circuit including a fuse circuit according to claim 1, wherein one of the pair of fuses comprises a copper wire.

15. The semiconductor integrated circuit including a fuse circuit according to claim 14, wherein the pair of fuses open when a current flows therethrough.

16. The semiconductor integrated circuit including a fuse circuit according to claim 5, further comprising:
- a first separating switch provided between the first fuse and the detector; and
- a second separating switch provided between the second fuse and the detector.

17. The semiconductor integrated circuit including a fuse circuit according to claim 16, further comprising:
- a third separating switch provided between the first fuse and the ground; and
- a fourth separating switch provided between the second fuse and the ground,
- wherein if one of the first fuse and the second fuse is blown, the respective one of the first separating switch and second separating switch is turned off and the respective one of the first blow switch and the second blow switch is turned on,
- wherein the respective third separating switch and fourth separating switch is turned off.

18. The semiconductor integrated circuit including a fuse circuit according to claim 1, wherein a respective one of the two blow switches and one of the pair of fuses are provided in series.

* * * * *